AUTOMATIC GAIN CONTROL CIRCUIT

Filed Sept. 30, 1958 2 Sheets-Sheet 1

INVENTOR.
CHARLES H. TAYLOR
BY
George T. Craig
ATTORNEY

Oct. 17, 1961 C. H. TAYLOR 3,005,094

AUTOMATIC GAIN CONTROL CIRCUIT

Filed Sept. 30, 1958 2 Sheets-Sheet 2

INVENTOR.
CHARLES H. TAYLOR
BY
George T. Craig
ATTORNEY

United States Patent Office 3,005,094

Patented Oct. 17, 1961

3,005,094

AUTOMATIC GAIN CONTROL CIRCUIT

Charles H. Taylor, Haddonfield, N.J., assignor to Radio Corporation of America, a corporation of Delaware Filed Sept. 30, 1958, Ser. No. 764,287
5 Claims. (Cl. 250—20)

The present invention relates to automatic gain control (AGC) circuits, and more particularly to novel automatic gain control circuits particularly useful in connection with single sideband (SSB) receivers.

Known AGC systems are basically carrier controlled. In one type of known system a portion of the output of the input signal channel is rectified and used to control gain in the input signal channel by adding rectified voltages to the initial or fixed bias of the amplifier stages in the channel. Another known system uses a separate amplifier in parallel with the signal channel amplifier. The separate amplifier is usually of fixed gain and supplies an AGC rectifier with an input which is directly proportional to the channel amplifier input. The voltage available at the AGC rectifier input is used to control gain in the signal input channel. In contrast to the foregoing, the novel AGC system of the present invention provides an AGC signal voltage which, in operation of electronic apparatus having an input signal channel and a following signal channel, is capable of holding the gain of the following signal channel substantially constant without subjecting the amplifier stages of the input signal channel to excessive cross modulation or overloading. This feature is, as indicated above, particularly useful in controlling gain in an SSB receiver.

Receivers for SSB suppressed carrier reception are usually designed to accept both upper and lower sidebands simultaneously. Useful but unrelated signals may then be received in both the upper and lower sideband portion of the acceptance spectrum simultaneously. The intermediate frequency (IF) amplifier must have a bandwidth at least twice that required by each sideband and the radio frequency (RF) amplifier bandwidth will generally exceed that of the IF system. Use of known AGC systems in an SSB receiver is undesirable for several reasons. If the AGC control voltage is derived from the IF channel before the signal passes through the means for separating and selecting the upper and lower sidebands the gain of the system is controlled by a voltage proportional to the energy in the IF pass band. This energy may be due to several signals plus the desired one. When the desired signal input is small compared to the total signal in the channel, or to a large signal in the unwanted sideband, system gain can be so small as to result in a strength of desired signal which is not usable. Deriving an AGC signal from the desired sideband can reduce the effect of attenuating a desired signal by a large signal in the undesired sideband. However, this is unsatisfactory because of overloading or blocking of the apparatus due to large signals in adjacent sidebands.

In accordance with the present invention an AGC voltage from each SSB channel is employed for comparison purposes. Each AGC signal may be derived from any point in each of the SSB channels provided that the signal in the channel is within frequency range of an SSB signal. The frequency range in each SSB channel is determined by a band pass filter. Conveniently, each AGC signal is derived from a rectifying device and each of these rectifying devices provides two voltages opposite in polarity and proportional to the sideband signal to be controlled. These rectifying devices may be supplied with a bias to delay action until the signal in each sideband channel exceeds some predetermined value. In one embodiment of the invention, each sideband channel includes two amplifier sections. The first section is normally operating at or near its maximum gain. The gain in this first section is reduced by the action of the rectifying device producing a negative AGC voltage when a large signal is present. The second amplifier section is supplied with a bias such that it operates at a low gain. A positive AGC voltage derived by comparison controls the second section of the amplifier by changing its bias to increase gain when necessary in order to hold the output constant. A feature of the present invention is the provision of an AGC voltage derived by comparison between or among AGC voltages developed in different channels. The derived AGC voltage is of appropriate polarity to exercise the desired gain control function.

If desired, an AGC rectifier may be employed to control the gain of RF and IF amplifiers which precede the means for separating and selecting the upper and lower sidebands. The purpose of controlling the gain of RF and IF amplifiers is to prevent overloading and cross modulation in early stages of receiver before the two sidebands are separated, and to hold the input to the sideband separating and selecting means at a reasonably constant level.

The principal object of the present invention is to provide a novel AGC system for electronic apparatus having a wide signal acceptance band in an initial portion thereof followed by a plurality of signal channels each having a more restricted signal acceptance band.

Another object of the invention is to provide a novel AGC system for an SSB receiver whereby substantially to eliminate the effect of undesired received signals in operation of the receiver.

A further object of the present invention is to provide a novel AGC system for an SSB receiver in which an AGC signal derived from the total signal in the initial stage or stages of the receiver is applied in a novel manner to aid in controlling the gain of the later narrower band stages of the receiver, which are themselves provided with novel means to produce automatic gain control voltages for each of the later narrower band stages.

A still further object of the present invention is to provide, in a radio receiver having a plurality of relatively narrow band signal channels, a novel gain control system operative to maintain the amplification capability equal and substantially constant in each of these relatively narrow channels.

Other objects and advantages of the present invention will, of course, become apparent and immediately suggest themselves to those skilled in the art to which the invention is directed from a reading of the following specification in connection with the accompanying drawing in which.

Figure 1:
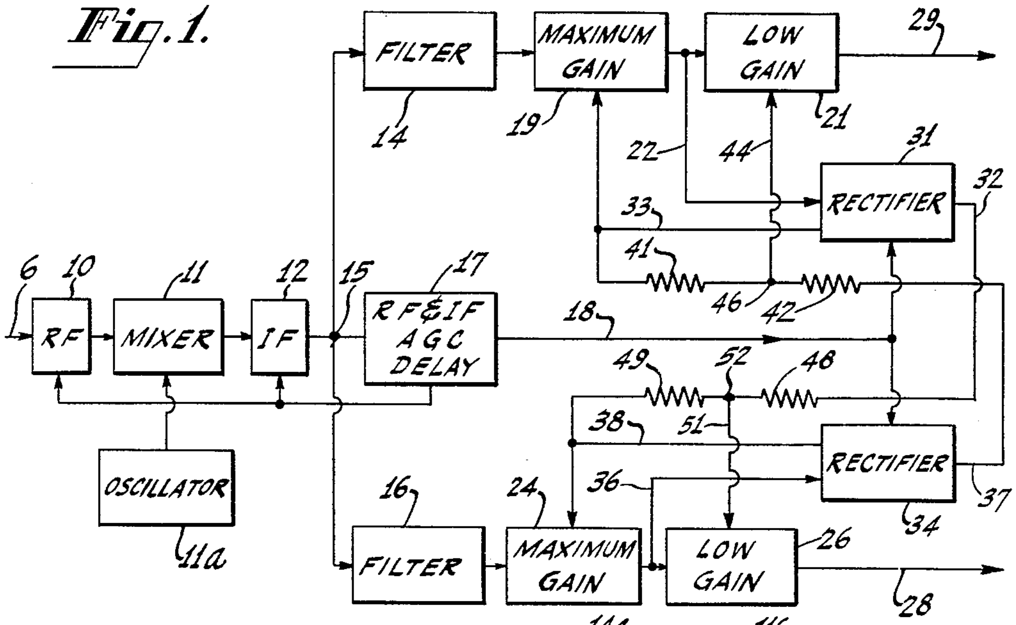
FIG. 1 is a schematic diagram of an AGC system embodying the present invention as incorporated in an SSB receiver.

Referring to the drawing, and for the present to FIG. 1 thereof, there is shown schematically, the usual sections of an SSB receiver having an RF amplifier 10, a converter or mixer 11, a local oscillator 11*a*, and an IF amplifier 12. The amplifier 10 is supplied from a connection 6 with a signal received by an antenna or by a radio or wire line signal relay system. In the usual SSB receiver, to which the invention is shown as being applied by way of example, the RF and IF stages accept upper and lower sideband signals simultaneously. The IF amplifier must have a bandwidth at least twice that required by the spectrum of each sideband and the RF amplifier bandwidth usually will exceed that of the IF amplifier. In the discussion which is to follow it will be assumed that the receiver is designed for, or is capable of, receiving and suitably demoduating suppressed carrier signals. However, as demodulating arrangements for suppressed carrier signals are well known, means for supplying the demoduating carrier locally is not shown.

The total signal in both sideband regions, as well as incidental noise appearing in the total acceptance band of the IF amplifier 12, appears at its output and is shown, schematically, as being applied to band pass filters 14 and 16. These filters each have an acceptance band suitable for passing the upper and lower sideband, respectively, of a received signal centered about an original carrier. The latter, however, is suppressed at the originating transmitter. The signal passed by the filter 14 may bear no relationship to the signal passed by the filter 16.

An AGC rectifying device 17 of the usual type receives the total signal passed by the IF amplifier 12. In accordance with well known practice, an AGC voltage derived from this rectifying device is applied, as shown schematically, to the RF amplifier 10 and to the IF amplifier 12. The AGC voltage derived from the rectifying device 17 is, usually, negative with respect to a circuit reference point. The more detailed showing of FIG. 2 indicates "ground" as the reference point. Reference character 18 designates a connection, later to be described, to the AGC system of this invention.

The band pass filter 14 has its output connected to an amplifier 19 which, as indicated by the legend on the drawing, is intended, without application of an AGC voltage, to operate at or near maximum gain. The output of the amplifier 19 is connected to an amplifier 21 which is adjusted to operate at a low gain level in the absence of an applied AGC voltage. From what has been stated herein, it will be appreciated that a negative AGC voltage is to be applied to the amplifier 19 and a positive AGC voltage is to be applied to the amplifier 21 for control purposes in operation of the system herein described. Reference character 29 designates, schematically, an output connection which may be connected to a signal utilizing device such, for example, as a detector-amplifier-loudspeaker combination, teleprinter equipment, or the like. The output of the filter 16 is connected to an amplifier 24 which is similar to the amplifier 19. The output of the amplifier 24 is connected to an amplifier 26 which is similar to amplifier 21. The output of the amplifier 26 is indicated schematically by a connection 28 which may provide signals to apparatus in a manner similar to that mentioned in describing the output connection 22 from the amplifier 21.

A rectifying device 31, to be described in more detail in connection with FIG. 2, receives, over a connection 22, the signal output of the amplifier 19 which, for example, represents the upper sideband signal. The rectifying device 31 provides a positive output voltage appearing in a connection shown schematically at 32. This rectifying device also provides a negative voltage output appearing in a connection shown schematically at 33. In a similar manner, a rectifying device 34 receives the signal output of the amplifier 24 over a connection indicated schematically at 36. The rectifying device 34 provides a positive voltage output to the connection indicated schematically at 37, and a negative voltage output to the connection indicated schematically at 38. The AGC voltage from the AGC rectifying device 17, appearing in the previously mentioned connection 18, may be applied to both rectifying devices 31 and 34 so as to modify their combined operation in jointly controlling the gain in the channel following the band pass filter 14 and the channel following the band pass filter 16.

The positive AGC voltage appearing in the connection 37 is compared with the negative voltage appearing in the connection 33. This is accomplished in the illustrative example by means of resistors 41 and 42. A connection 44 to the junction point 46 of these resistors applies the resultant AGC voltage to the amplifier 21. It will be understood by those skilled in the art that the schematic arrangement illustrated by the resistors 41 and 42 may be in the nature of a potentiometer and that the connection 44 may be made to the sliding connection of the potentiometer (not shown) thereby to provide an additional adjustment feature.

The connection 32 communicates with a resistor 48. A resistor 49 is connected at one end to the connection 38. A connection 51 connects the junction point 52 of the resistors 48 and 49 to the amplifier 26. As pointed out above, resistors 48 and 49 may also be combined into a single potentiometer resistor.

In operation of the arrangement shown in FIG. 1, it will first be assumed that the incoming total signal applied to the RF amplifier 10 includes two SSB signals which may or may not be related and originate at the same transmitter. The total signal is applied to the filters 14 and 16. The filter 14, in the illustrative example, selects the signal corresponding to the upper sideband signal in the acceptance band of the amplifier 10 and the filter 16 selects the lower sideband signal. When the signal in the output of the filter 14 is substantially equal to the signal output of the filter 16, the comparison signal appearing in the connection 44 and in the connection 51 is substantially zero and there will be no change in gain of the amplifier 21 or the amplifier 26. More in detail, the rectifying device 17 supplies an AGC voltage to hold the signal at the point 15 substantially constant. The signal at the point 15 includes everything the IF system is capable of passing. This is about twice the bandwidth required for each sideband, as pointed out above. The amplifiers 19, 21, 24 and 26 will be adjusted substantially to the same gain. The outputs appearing in the connections 29 and 28 will also be substantially equal.

When the upper and lower sideband signals accepted by the RF amplifier 10 are not equal, the output of the rectifying devices will be unequal. If the lower sideband signal, appearing in the output of the filter 16, is large compared to the upper sideband signal appearing in the output of the filter 14, the positive AGC voltage appearing in the connection 37 will exceed the negative voltage in the connection 33 by an amount proportional to the difference between the signals. The resulting positive voltage is used to increase the gain of the amplifier 21 to give a normal output.

Figure 2:
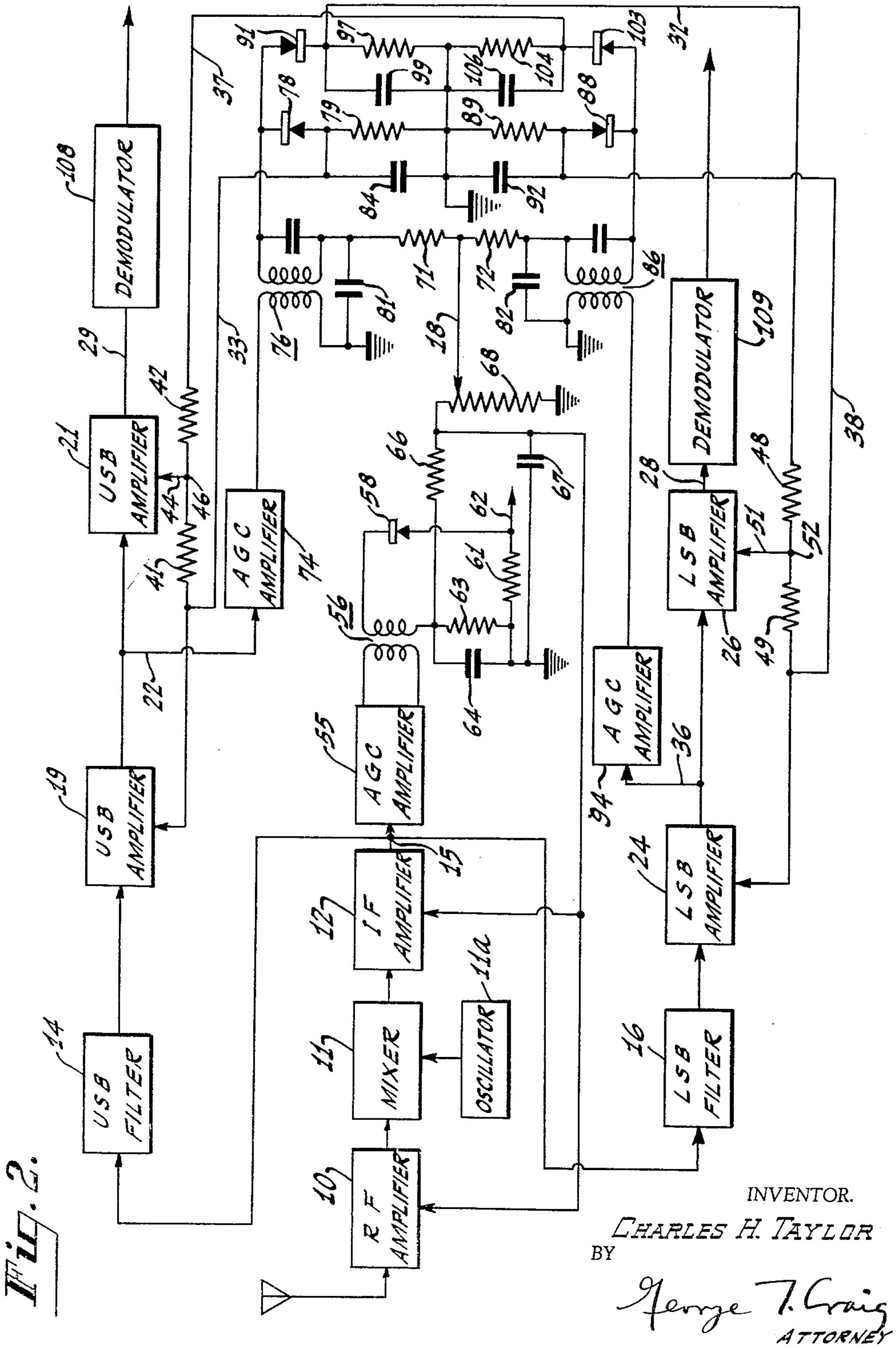
FIG. 2 is a more detailed showing of the circuitry of the apparatus of FIG. 1.

In describing FIG. 2 of the drawing, similar reference characters will be used, where applicable, to indicate similar or the same devices in FIG. 1 without further detailed description thereof. An AGC amplifier 55 is connected to the point 15 and is coupled by a transformer 56 to an AGC rectifier 58. The elements 55, 56 and 58 correspond in function to the AGC rectifying device 17 of FIG. 1. The anode of the rectifier 58 is connected to a potential reference point such, for example, as ground by way of a resistor 61. Delayed AGC voltage may be applied by way of a terminal 62, if desired, to produce a current flow in the resistor 61 thereby to develop an additional voltage drop. The circuit including the rectifier 58 and the secondary of the transformer 56 also includes a resistor 63 shunted by a capacitor 64 which develops the AGC voltage drop. An AGC filter comprising a resistor 66 and a capacitor 67 applies the suitably filtered AGC voltage to the resistor 68 of a potentiometer. The connection 18 indicated in FIG. 2 corresponds to the connection 18 shown in FIG. 1 of the drawing. One end of the potentiometer resistor 68 is connected to ground which, in effect, is the ground for the midpoint of resistors 71 and 72. The resistors 71 and 72 are effectively shunted by capacitors 81 and 82, respectively.

The connection 22 of FIG. 2, corresponding to the connection 22 of FIG. 1, communicates with an AGC amplifier 74. The output of the amplifier 74 is coupled to a transformer 76, the secondary of which is included in an AGC circuit comprising the resistor 71, a rectifier 78 and a resistor 79. This AGC rectifying circuit is completed by way of ground connections. Resistor 79 is shunted by a capacitor 84. Various time constants may be used for the AGC circuits but in general they should be of the fast operate-slow release type so as to give AGC voltages of this character in the combining circuits. A negative AGC voltage is taken from the anode of the rectifier 78 for connection to the resistor 41 as previously explained in connection with FIG. 1 of the drawing.

A circuit similar to the one previously described for developing an AGC voltage includes the secondary of a transformer 86, the rectifier 88, a resistor 89 and the resistor 72. The resistor 89 is shunted by a capacitor 92. An AGC amplifier 94 receives its input from the connection 36 and its output supplies the primary of the transformer 86. The anode of the rectifier 88 communicates over the connection 38 with one end of the combining resistor 49.

The secondary of the transformer 76 also supplies an AGC rectifying circuit comprising a rectifier 91, a resistor 97 and the resistor 71. The resistor 97 is shunted by a capacitor 99. The positive AGC voltage developed at the cathode of the rectifier 91 is applied by way of the connection 32 to one end of the combining resistor 48. The junction 52 of the combining resistors 48 and 49 is connected to the amplifier 56 by way of connection 51.

In addition to the previously described AGC circuit comprising the rectifier 88, the secondary of the transformer 86 supplies an AGC circuit comprising a rectifier 103, a resistor 104, and the resistor 72. The resistor 104 is shunted by a capacitor 106. The cathode of the rectifier 103 is connected through the connection 37 to one of the combining resistors 42.

The output connections 29 and 28 of the sideband channels are shown as connected to demodulators 108 and 109. The output of these demodulators, as indicated above, may be the original modulating signals at the inputs to the transmitter modulator or modulators and may be of any character affording the desired type of communication. From the discussion of FIG. 1 appearing above, it is believed that the operation of the more detailed showing of FIG. 2 will be fully understood.

Figures 3, 4:
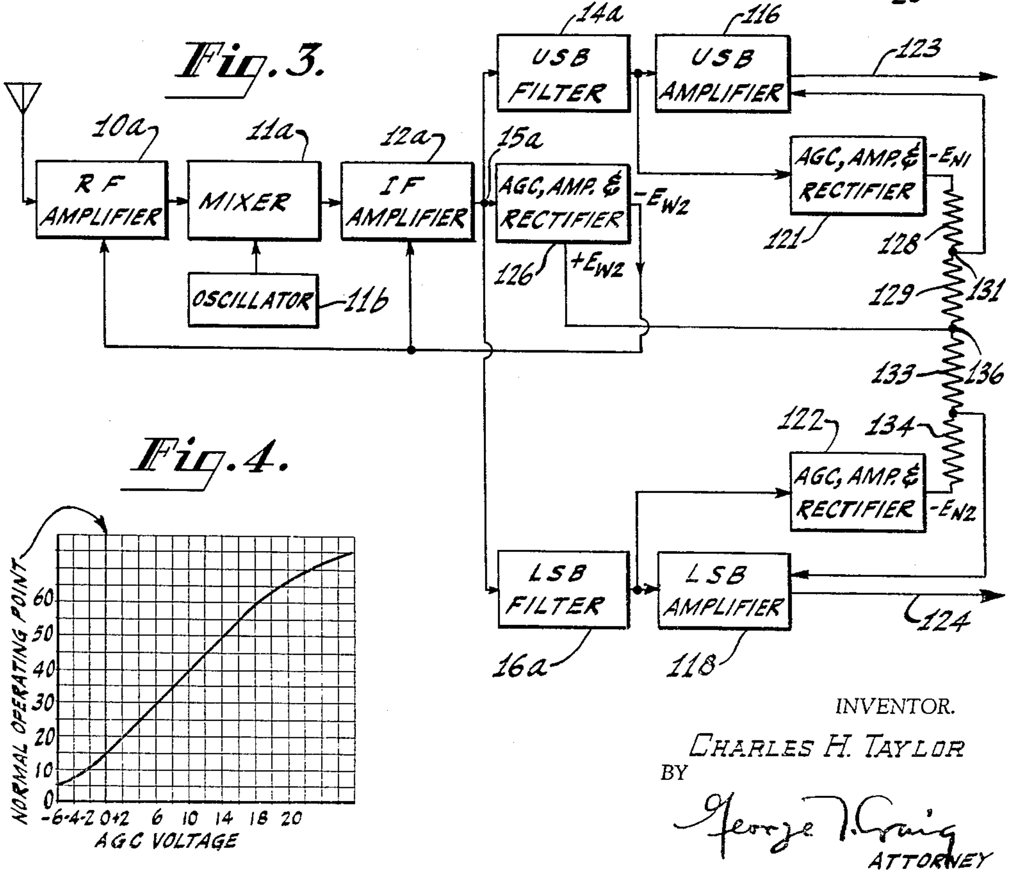
FIG. 3 is a schematic diagram of an AGC system embodying the present invention applied in modified form to control the gain of an SSB receiver.
FIG. 4 is a curve showing gain vs. control voltage of one of the SSB amplifiers of FIG. 3.

FIG. 3 of the drawing shows a modification of the AGC system of FIGS. 1 and 2. In the description of FIG. 3 the reference characters appearing in FIGS. 1 and 3 will again be employed but with a suitable suffix. The RF amplifier 10*a* receives signals from a suitable source such as an antenna and these signals are supplied to a mixer 11*a*. An oscillator 11*b* is associated in the usual manner with the mixer 11*a*. The latter supplies signals to an IF amplifier 12*a* and these signals in amplified form appear at the point 15*a*. The upper and lower sideband filters 14*a* and 16*a*, respectively, are fed with the signal appearing at the point 15*a*.

The upper sideband filter 14*a* feeds the selected upper sideband signal to an upper sideband amplifier 116. The lower sideband filter 16*a* feeds its signal to the lower sideband amplifier 118. The signal passed by the upper sideband filter 14*a* is also fed to an AGC amplifying and rectifying device 121. The signal appearing in the lower sideband filter 16*a* is fed to an AGC amplifying and rectifying device 122. The negative voltage output from the AGC amplifying and rectifying device 121 is compared with the positive voltage output of an AGC amplifying and rectifying device 126 by means of resistors 128 and 129. The junction point 131 of these resistors is connected to provide an AGC voltage to the upper sideband amplifier 116. The character of this voltage is indicated on the abscissa of the plot in FIG. 4 of the drawing.

Voltage comparison is obtained in a similar manner by resistors 133 and 134. These resistors compare the positive AGC voltage output of the AGC amplifying and rectifying device 126 with the negative output of the AGC amplifying and rectifying device 122. The junction point 136 of these resistors is connected to the AGC amplifying and rectifying device 122. It will be understood that the AGC voltages discussed herein are referred to a circuit reference point such, for example, as ground. The manner in which this may be done is indicated more in detail in the illustrative example of FIG. 2 wherein AGC circuitry is shown more in detail.

Output signals from the upper sideband amplifier 116 and the lower sideband amplifier 118 appear, respectively, in the connections 123 and 124. The latter correspond to the connections 22 and 28 of FIG. 1 of the drawing.

The total signal appearing at the point 15*a*, which is the output signal of the wideband IF amplifier 12*a*, is applied to an AGC amplifying and rectifying device 126. The latter may correspond in circuit details to the arrangement shown in FIG. 2 which is fed by the transformer 56. However, the amplifying and rectifying device 126 is of such a character that it provides a negative voltage $-E_{w1}$ and a positive AGC voltage $+E_{w2}$. The RF and IF amplifiers are of conventional design operating at their maximum gain until some predetermined level is reached, after which gain is reduced by action of the negative voltage $-E_{w1}$. The AGC system, in view of this, preferably operates as a delayed AGC system which is well known and need not be further described. The rectified outputs of the sideband AGC amplifiers are proportional to and in the same ratio as the corresponding signals at the input to the RF amplifier 10*a*. The sideband amplifiers 116 and 118 are designed to operate at a mean gain sufficient to produce normal output when the sideband signals and the D.C. control voltages $-E_{n1}$ and $-E_{n2}$ are equal. FIG. 4 of the drawing indicates the characteristic of these amplifiers and upon application of an AGC voltage obtained in the manner to be described. A semi-fixed cathode bias sets the normal operating point of each amplifier as indicated on FIG. 4.

Operation of the embodiment of FIG. 3 will be described by explaining its action under three operating conditions. With equal sideband signals applied at the input of the RF amplifier 10*a*, the output of the filters 14*a* and 16*a*, the sideband AGC control voltages, and the sideband amplifier gains for each channel will be equal. The AGC control voltage is the difference between the positive rectified wideband voltage $E_{w2}$ and the negative voltage $E_{n1}$ or $E_{n2}$, depending on the sideband. Each of these voltages will produce the same value of difference voltage and in the same polarity when subtracted from $E_{w2}$. These difference voltages are the AGC control voltages applied to the variable gain sideband amplifiers to control the output of the channels.

Operation will now be explained when there are unequal signals in the sideband portions of the total acceptance band of the RF amplifier 10*a*. As was pointed out previously, the same signals will be impressed on the two filters 14*a* and 16*a*. The outputs of the filters will be in the same ratio as were the two signals at the input to the RF amplifier 10*a*. The action of the voltage $-E_{w1}$ will be to hold the input to the filters approximately constant over a wide range of input values and this input will be about the same as is the case previously discussed when the sideband signals were equal. The negative voltages $E_{n1}$ and $E_{n2}$ will be of different values proportional to the outputs of the respective filters. The smaller one, representing the smaller signal will produce a positive difference voltage when subtracted from $E_{w2}$. This difference voltage will increase with a decrease in input signal to the corresponding sideband. The positive AGC control voltage will cause the sideband amplifier gain to be increased enough to produce standard output from that channel.

Similar action will take place in the other channel. However, since the signal input is larger, the difference voltage will be smaller and the gain of the sideband amplifier will be changed by a smaller amount. This will result in the output of the two sideband amplifiers being approximately equal.

When there is a signal in one sideband only of the acceptance band of the RF amplifier 10a, the signal input to the filters will be approximately of the same value as in the other two cases discussed above. One filter will pass all of the signal with the other filter passing only the noise in its channel. This noise value will depend on the gain of the RF and IF amplifiers and thus on the value of the signal applied to the RV amplifier 10a. The channel in which the signal appears will produce an $E_n$ voltage approximately equal to the $E_{w2}$ voltage. The difference voltage will be smaller and the sideband amplifier will operate at its normal gain and produce a normal signal output. The channel containing only noise will produce a small $E_n$ voltage, resulting in a large increase in gain of the channel amplifier. The gain of this channel will be at maximum when the RF and IF gain is kept at a low value due to a large signal in the other sideband. Operation in the case just discussed is very similar to that discussed in the immediately foregoing when widely different signal levels for the two sidebands are present.

What is claimed is:

1. A circuit for producing an automatic gain control voltage for electronic apparatus having a single wide signal acceptance band means in an initial portion thereof followed by a pair of signal channels each having a more restricted signal acceptance band, means coupled to said wide signal acceptance band means for developing an automatic gain control voltage, means for separating said total signal into a pair of signals, means for feeding each of said pair of signals to a respective more restricted signal channel providing a pair of relatively narrow band signals, means for developing a pair of voltages, each of said pair of voltages being proportional to said signal in the respective one of said restricted channels, means for applying said first developed gain control voltage to said means for developing a pair of voltages, means for comparing said pair of developed voltages to develop a first comparison voltage becoming more positive as said signal strength increases in said first channel, means for again comparing said pair of developed voltages to develop a second comparison voltage becoming more positive as said signal in said second channel increases, means for applying said first comparison voltage to said second channel to increase the gain thereof as said signal in said first channel increases, means for applying said second comparison voltage to said first channel to increase the gain thereof as said signal in said second channel increases.

2. In a radio receiver having a single wideband radio frequency amplifier, conversion means, a single wideband intermediate frequency amplifier, and an upper sideband channel filter and a lower sideband channel filter; an automatic gain control system comprising a rectifying device connected to said intermediate frequency amplifier, said rectifying device having means to provide an automatic gain control voltage, an upper sideband amplifier and a lower sideband amplifier, means associated with each respective sideband filter to provide signals to a corresponding one of said amplifiers, each of said amplifiers and corresponding one of said respective filters comprising one of a plurality of sideband channels, a rectifying device connected to each of said sideband channels to receive signals therefrom, said sideband channel rectifying devices each having means to provide an automatic gain control voltage, means for comparing said automatic gain control voltage provided by said rectifying device connected to said intermediate frequency amplifier with said gain control voltage provided by said sideband channel rectifying devices whereby to provide a plurality of comparison gain control voltages, and means for applying said comparison gain control voltages to control signal gain in a respective sideband channel.

3. In a radio receiver having a single wideband radio frequency amplifier, conversion means, a single wideband intermediate frequency amplifier, and an upper sideband channel filter and a lower sideband channel filter; an automatic gain control system comprising a rectifying device connected to said intermediate frequency amplifier, said rectifying device having means to provide an automatic gain control voltage, means to apply said gain control voltage to said radio frequency amplifier and to said intermediate frequency amplifier, an upper sideband amplifier and a lower sideband amplifier, means associated with each respective sideband filter to provide signals to a corresponding one of said amplifiers, each of said amplifiers and corresponding one of said respective filters comprising one of a plurality of sideband channels, a rectifying device connected to each of said sideband channels to receive signals therefrom, said sideband channel rectifying devices each having means to provide an automatic gain control voltage, means for comparing said automatic gain control voltage provided by said rectifying device connected to said intermediate frequency amplifier with said gain control voltage provided by said sideband channel rectifying devices whereby to provide a plurality of comparison gain control voltages, and means for applying said comparison gain control voltages to control signal gain in a respective sideband channel.

4. An automatic gain control system for a single sideband receiver, said receiver comprising a single wideband signal receiving and converting channel, an upper sideband filter, an upper sideband amplifier operatively coupled to said upper sideband filter to provide an upper sideband channel, a lower sideband filter, a lower sideband amplifier operatively coupled to said lower sideband filter to provide a lower sideband channel, an upper sideband AGC amplifying and rectifying device, means for supplying signals from said upper sideband channel to said upper sideband AGC amplifying and rectifying device, a lower sideband AGC amplifying and rectifying device, means for supplying signals from said lower sideband channel to said lower sideband AGC amplifying and rectifying device, a third AGC amplifying and rectifying device, means for supplying signals from said wideband signal receiving and converting channel to said third AGC amplifying and rectifying device, said third AGC amplifying and rectifying device having means for developing a negative automatic gain control voltage, means for applying said negative automatic gain control voltage to said wideband signal receiving and converting channel to control the gain thereof, said upper sideband AGC amplifying and rectifying device having means for developing a positive and a negative AGC voltage, said lower sideband amplifying and rectifying device having means for developing a positive and a negative AGC voltage, means for comparing said positive AGC voltage from said upper sideband AGC amplifying and rectifying device with said negative AGC voltage from said lower sideband AGC amplifying and rectifying device to provide a first comparison AGC voltage, means operatively to apply said first comparison AGC voltage to said lower sideband channel, means for comparing said positive AGC voltage from said lower sideband AGC amplifying and rectifying device with said negative AGC voltage from said upper sideband amplifying device to provide a second comparison AGC voltage, and means operatively to apply said second comparison AGC voltage to said upper sideband channel.

5. An automatic gain control system for a single sideband receiver, said receiver comprising a single wideband signal receiver, said receiver comprising a wideband signal receiving and converting channel, an upper sideband filter, an upper sideband amplifier operatively coupled to said upper sideband filter, a lower sideband filter, a lower sideband amplifier operatively coupled to said lower sideband filter, an upper sideband AGC amplifying and rectifying device, means for supplying signals from said upper sideband filter to said upper sideband AGC amplifying and rectifying device, a lower sideband AGC amplifying and rectifying device, means for supplying signals from said lower sideband filter to said lower AGC amplifying and rectifying device, a third AGC amplifying and rectifying device, means for supplying signals from said wideband signal receiving and converting channel to said third AGC amplifying and rectifying device, said third AGC amplifying and rectifying device having means for developing a negative automatic gain control voltage and means for developing a positive automatic gain control voltage, means for applying said negative automatic gain control voltage to said wideband signal receiving and converting channel to control the gain thereof, means for comparing said last-named positive AGC voltage with the AGC output of said upper sideband AGC amplifying and rectifying device thereby to develop a first comparison AGC voltage, means for applying said first comparison AGC voltage to said upper sideband amplifier, means for comparing said last-named positive AGC voltage from said third amplifying and rectifying device with the AGC output of said lower sideband amplifying and rectifying device thereby to develop a second comparison AGC voltage, and means for applying said second comparison AGC voltage to said lower sideband amplifier.

References Cited in the file of this patent

UNITED STATES PATENTS

| | | |
|---|---|---|
| 2,303,542 | Goddard | Dec. 1, 1942 |
| 2,400,073 | Cawein | May 14, 1946 |
| 2,491,918 | De Boer et al. | Dec. 20, 1949 |
| 2,783,372 | Peterson et al. | Feb. 26, 1957 |

FOREIGN PATENTS

| | | |
|---|---|---|
| 663,664 | England | Dec. 27, 1951 |